(12) United States Patent
Yamada

(10) Patent No.: US 8,354,600 B2
(45) Date of Patent: Jan. 15, 2013

(54) PRINTED WIRING BOARD AND ELECTRONIC DEVICE

(75) Inventor: Tetsuro Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 365 days.

(21) Appl. No.: 12/612,870

(22) Filed: Nov. 5, 2009

(65) Prior Publication Data
US 2010/0116538 A1    May 13, 2010

(30) Foreign Application Priority Data

Nov. 10, 2008  (JP) ................................. 2008-287839

(51) Int. Cl.
*H05K 1/11* (2006.01)
(52) U.S. Cl. ........................................ 174/262; 174/260
(58) Field of Classification Search .................. None
See application file for complete search history.

(56) References Cited

U.S. PATENT DOCUMENTS

| | | | |
|---|---|---|---|
| 6,764,931 B2 * | 7/2004 | Iijima et al. | 438/584 |
| 6,847,527 B2 * | 1/2005 | Sylvester et al. | 361/763 |
| 2003/0146020 A1 * | 8/2003 | Brist et al. | 174/262 |
| 2005/0035927 A1 | 2/2005 | Kimura | |
| 2006/0243478 A1 * | 11/2006 | Inagaki et al. | 174/255 |

FOREIGN PATENT DOCUMENTS

| | | |
|---|---|---|
| JP | 2000-208941 A | 7/2000 |
| JP | 2005-019527 A | 1/2005 |
| JP | 2005-064828 A | 3/2005 |
| JP | 2007-200971 A | 8/2007 |
| JP | 2007-324232 A | 12/2007 |

OTHER PUBLICATIONS

Notification of Reasons for Refusal dated Nov. 13, 2012, issued in corresponding Japanese Patent Application No. 2008-287839, with English translation (6 pages).

* cited by examiner

*Primary Examiner* — Ishwarbhai Patel
(74) *Attorney, Agent, or Firm* — Westerman, Hattori, Daniels & Adrian, LLP

(57) ABSTRACT

A printed wiring board includes a land formed on a surface layer, at least one power supply pattern formed on a layer except the surface layer on which the land is formed, a plurality of vias which includes a first via electrically connected to the power supply pattern and a second via electrically connected to the power supply pattern and the first via and the second via are electrically connected to the land.

11 Claims, 10 Drawing Sheets

PRINTED WIRING BOARD AND ELECTRONIC DEVICE

CROSS-REFERENCE TO RELATED APPLICATION

This application is based on and claims the benefit of priority of the prior Japanese Patent Application No. 2008-287839, filed on Nov. 10, 2008, the entire contents of which are incorporated herein by reference.

FIELD

The present application relates to a printed wiring board on which an LSI package component(s) is mounted and an electronic device.

BACKGROUND

Grid array type packages, for example, a ball grid array (BGA), a chip size package (CSP), a pin grid array (PGA) or the like, are typically mounted on a printed wiring board.

FIG. 1 illustrates a schematic view indicative of an area of the printed wiring board on which a grid array type package (s) is mounted.

In the grid array type package, package terminals are arranged in a two-dimensional manner on a bottom thereof. On a printed wiring board 10, connection pads 11 electrically connected to each of the package terminals are also arranged in the two dimensional manner in response to the package terminals arranged on the bottom of the grid array type package.

A portion shown by a circle R in FIG. 1 indicates a connection pad 11A. The connection pad 11A is a connection pad to which a package terminal for supplying power is electrically connected.

FIGS. 2 through 4 illustrate enlarged views (A) of the portion shown by the circle R in FIG. 1 and sectional views (B) thereof. Each of the views indicates examples of conventional techniques.

According to an example of a first conventional technique illustrated in FIG. 2, a footprint 11 is formed at a portion, on which a package terminal 20 is directly mounted, on a top face of a printed wiring board 10A. Note that the "top face" means a surface on a side on which the package terminal 20 is electrically connected. The footprint 11 is electrically connected to a through-via 13 which is formed by penetrating through a top face and a bottom face of the printed wiring board 10A via a lead-out pattern 12. The through-via 13 is electrically connected to power supply layers 19 in the printed wiring board 10A.

Moreover, in a printed wiring board 10B according to an example of a second conventional technique illustrated in FIG. 3, there is formed a chip on hole (COH) 16 where a conductive material fills the through-via 13, and a footprint 11 is formed thereon.

Furthermore, in a printed wiring board 10C according to an example of a third conventional technique illustrated in FIG. 4, a build up layer 14 is formed on a top face and a bottom face of a printed wiring board 10C after a via 13' has been formed. The via 13' does not penetrate through the printed wiring board 10C between the front face and the bottom face thereof. A build up via 15 is formed at a position close to the via 13'. The build up via 15 is formed by penetrating through the build up layer 14 present on the top face of the printed wiring board 10C and reaches down to a power supply layer 19A, which is the shallowest layer in power supply layers 19, in the printed wiring board 10C. A footprint 11 is formed on the buildup via 15. A package terminal 20 is electrically connected to a power supply layer 19A via the footprint 11 and the buildup via 15. According to the example of the third conventional technique, the via 13' has nothing to do with electrical connection with regard to the package terminal.

According to each of the examples of the conventional techniques discussed above, it has been typical that the footprint illustrated in FIGS. 2 through 4 is formed, and the package terminal and the power supply layers are electrically connected by using one via due to wiring restriction and physical restriction. However, an allowable current value per one via is made lower because a via diameter is being made smaller and smaller for a trend in recent years in which a large number of pins is arranged at reduced pitches. On the other hand, a current value for a package itself is increasing more and more due to the recent trend. For this reason, package dimensions grow in size because a further increased number of pins may be necessary in order to secure a preferable amount of current. The growth in size of a package dimension causes an increase in expansion and contraction at end portions of the package due to a variation in temperatures, and this may result in a decrease in reliability after the package is mounted on the printed wiring board.

Japanese Laid-Open Patent Publication No. 2000-208941 discusses a build up wiring board in which a path of the wiring may be changed in response to a wiring distance. Furthermore, Japanese Laid-Open Patent Publication No. 2005-19527 discusses a printed wiring board in which a resistance value of the via of the printed wiring board is a desirable value. Moreover, Japanese Laid-Open Patent Publication No. 2005-64828 discusses a technique in which a current phase caused to flow through a ground through hole and a current phase caused to flow through a power supply through hole are reversed, so that an impedance of each of the through holes may be reduced.

SUMMARY

Accordingly, it is an object of the disclosed embodiments to provide a printed wiring board that includes a land formed on a surface layer, at least one power supply pattern formed on a layer except the surface layer on which the land is formed, a plurality of vias which includes a first via electrically connected to the power supply pattern and a second via electrically connected to the power supply pattern and the first via and second via are electrically connected to the land.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter embodiments of a printed wiring board and an electronic device according to the present disclosure will be disclosed.

Figure 1:
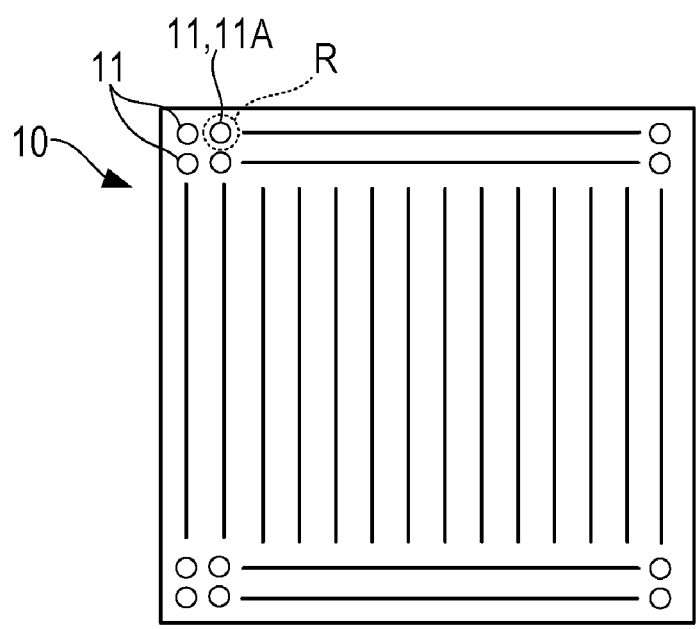
FIG. 1 illustrates a schematic view indicative of the printed wiring board that includes an area on which a grid array type package(s) is mounted.
Figure 2A:
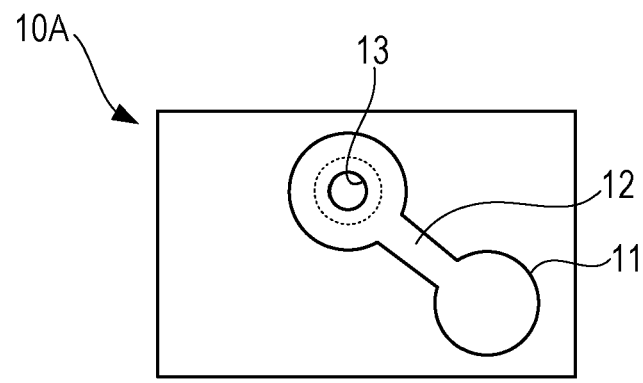
FIGS. 2A and 2B illustrate an enlarges view (A) of the area denoted by the circle R in FIG. 1 and a sectional view (B) thereof, illustrating an example of a first conventional technique.
Figure 2B:
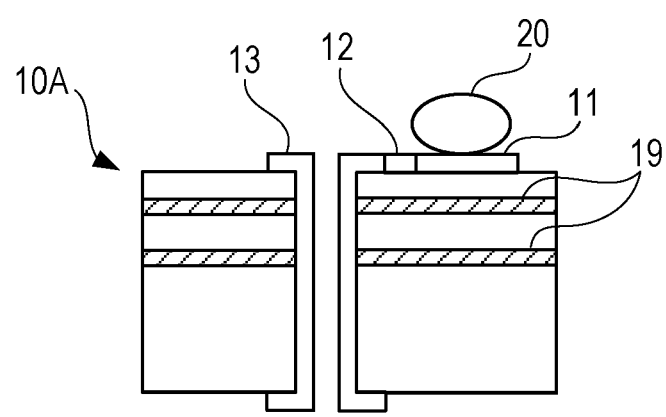
Figure 3A:
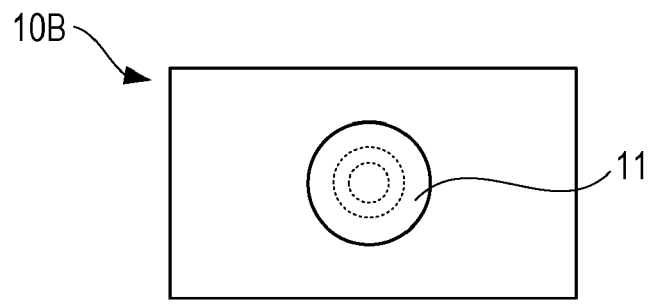
FIGS. 3A and 3B illustrate an enlarges view (A) of the area denoted by the circle R in FIG. 1 and a sectional view (B) thereof, illustrating an example of a second conventional technique.
Figure 3B:
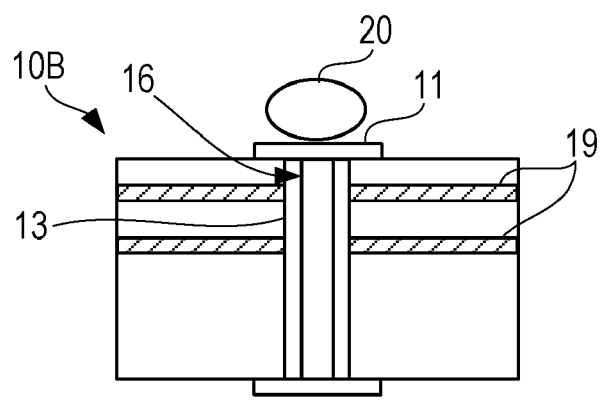
Figure 4A:
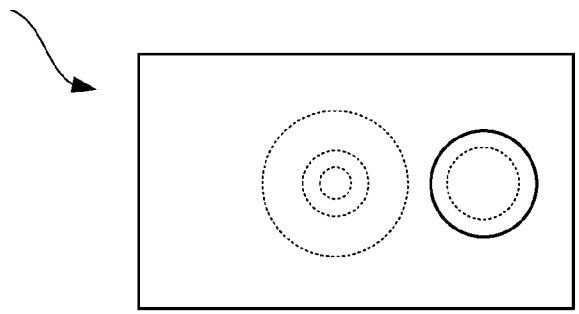
FIGS. 4A and 4B illustrate an enlarges view (A) of the area denoted by the circle R in FIG. 1 and a sectional view (B) thereof, illustrating an example of a third conventional technique.
Figure 4B:
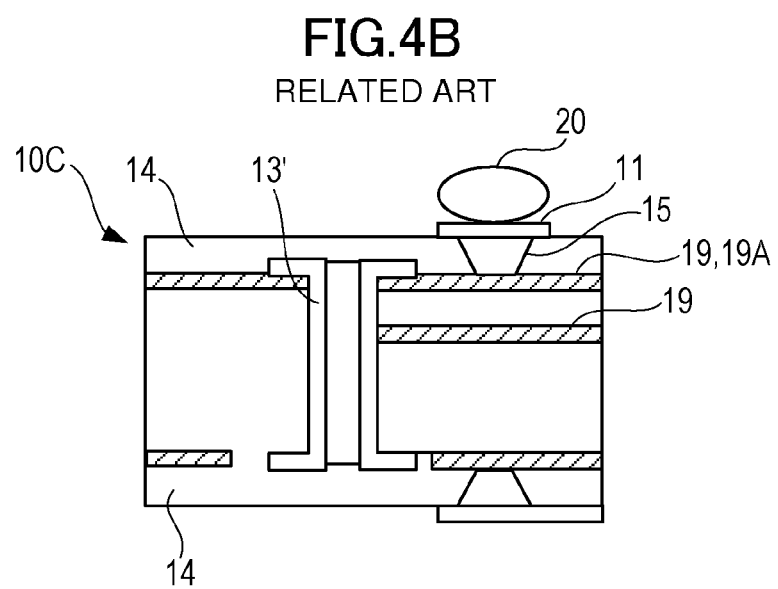
Figure 5:
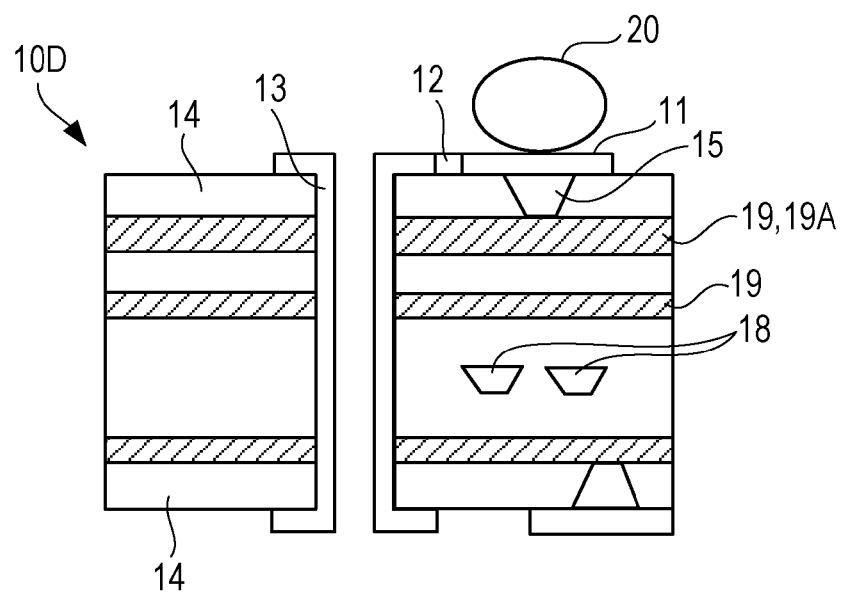
FIG. 5 illustrates a sectional view indicative of a printed wiring board according to a first embodiment.

FIG. 5 illustrates a sectional view indicative of a printed wiring board according to a first embodiment. With regard to FIG. 5 and the each of the following drawings, the same numerical references are attached to structural elements that are the same as those in FIGS. 2 through 4 indicative of conventional printed wiring boards, and description is made by mainly focusing on differences therebetween.

A printed wiring board 10D in FIG. 5 includes a plurality of conductive layers. The plurality of conductive layers further includes power supply layers 19 and a wiring layer in which wiring patterns 18 are formed. The printed wiring board 10D is a printed wiring board formed by alternately laminating a conductive layer and an insulating layer.

The printed wiring board 10D includes a build up layer 14 and a through-via 13. The build up layer 14 is formed on a top face and a bottom face of the printed wiring board 10D. The through-via 13 is formed by penetrating the printed wiring board 10D from the top face to the bottom face thereof. The through via 13 is electrically connected to the power supply layers 19 spreading over the inside of the printed wiring board 10D.

Furthermore, a build up via 15 is formed on the printed wiring board 10D. The build up via 15 is formed by penetrating the build up layer 14 on a side of the top face and reaches down to a power supply layer 19A which abuts the build up layer 14. On the build up via 15, there is formed a footprint 11 to which a package terminal 20 is electrically connected, and the footprint 11 is electrically connected to the through-via 13 through a lead-out pattern 12.

In the printed wiring board 10D according to the first embodiment illustrated in FIG. 5, the package terminal 20 is electrically connected to the power supply layers 19 from the footprint 11 via the lead-out pattern 12 and the through-via 13. The package terminal 20 is also electrically connected to the power supply layer 19 through the build up via 15 from the footprint 11.

As disclosed above, the package terminal 20 is electrically connected to the power supply layers 19 through a plurality of separate paths, according to the first embodiment illustrated in FIG. 5. Even in a package where a large number of pins is arranged at reduced pitches, a current value equal to or greater than that achieved by conventional techniques may be secured for the current value per one package terminal.

In addition, according to the first embodiment illustrated in FIG. 5, since the build up via 15 reaches down to the power supply layer 19A next to the build up layer 14, the build up via 15 does not hinder paths of the wiring pattern 18 in a wiring layer which is deeper than the power supply layer 19A. Moreover, an amount of reduction in wiring capacitance of the printed wiring board 10D may be reduced to a minimum.

Figure 6:
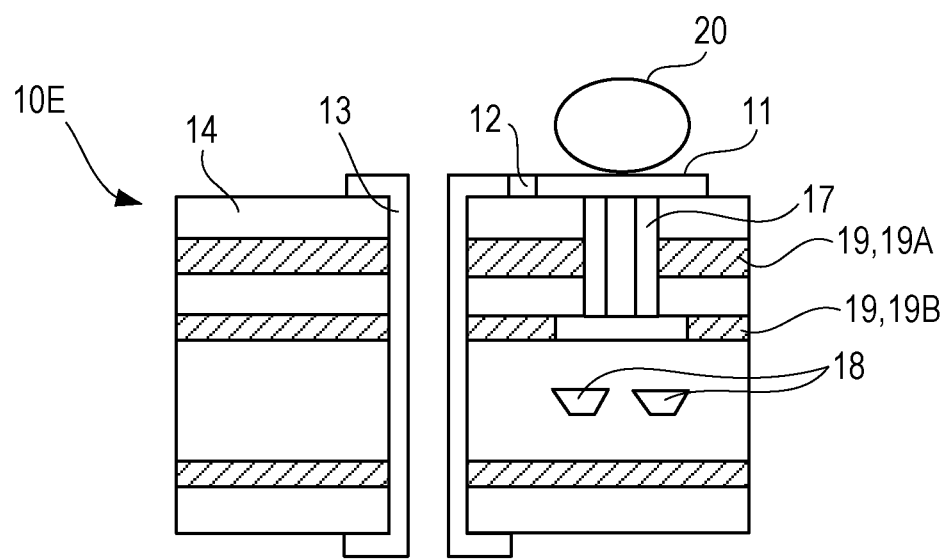
FIG. 6 illustrates a sectional view indicative of a printed wiring board according to a second embodiment.

FIG. 6 illustrates a sectional view indicative of a printed wiring board according to a second embodiment. Hereinafter differences between the printed wiring board according to the second embodiment illustrated in FIG. 6 and the printed wiring board 10D according to the first embodiment illustrated in FIG. 5 will be disclosed.

A printed wiring board 10E according to the second embodiment illustrated in FIG. 6 includes a surface via hole (an SVH) or an interstitial via hole (an IVH) 17 which is formed instead of the buildup via 15 in the printed wiring board 10D according to the first embodiment illustrated in FIG. 5. The SVH 17 reaches down to a power supply layer 19B which is formed as a second layer (layered from a top face to a bottom surface) in a plurality of power supply layers 19. The SVH (or the IVH) 17 is electrically connected to both of a power supply layer 19A as a first layer, which is positioned close to the top face, and a power supply layer 19B as the second layer.

In the second embodiment illustrated in FIG. 6, a package terminal 20 is not only electrically connected to the power supply layer 19 via a through-via 13 but also electrically connected to the power supply layers 19 through the SVH (or the IVH) 17. Not only a reduction in an amount of wiring capacitance is reduced but also an amount of current value per one package terminal is secured by virtue of the plurality of paths which are electrically connected to the power supply layers 19.

Figure 7:
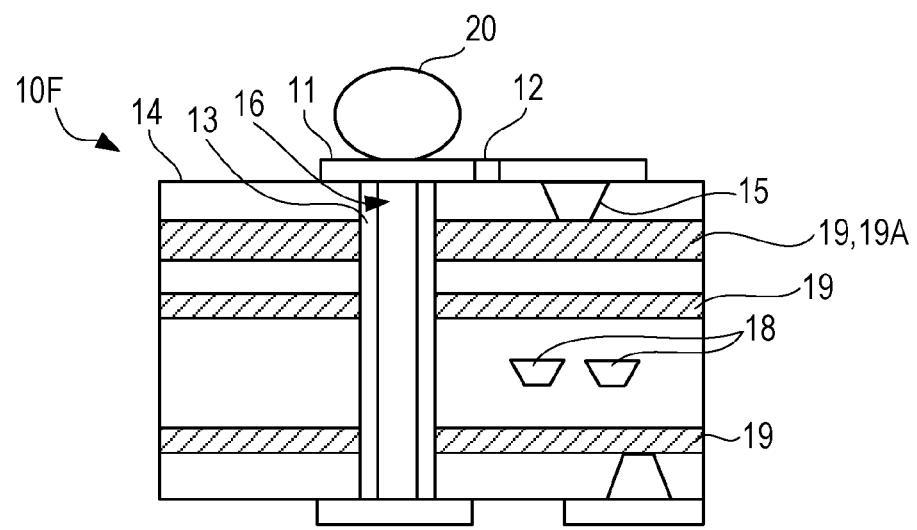
FIG. 7 illustrates a sectional view indicative of a printed wiring board according to a third embodiment.

FIG. 7 illustrates a sectional view indicative of a printed wiring board according to a third embodiment. Hereinafter differences between the printed wiring board according to the third embodiment illustrated in FIG. 7 and the printed wiring board 10D according to the first embodiment illustrated in FIG. 5 will be disclosed.

A printed wiring board 10F according to the third embodiment illustrated in FIG. 7 includes a footprint 11 that is formed on a through-via 13. It is different from the first embodiment illustrated in FIG. 5 where the footprint 11 is formed on the build up via 15. In addition, a COH 16 is formed by filling the through-via 13 with a conductive material, in the printed wiring board 10F illustrated in FIG. 7. A package terminal 20 is electrically connected to the footprint 11 that is located on a top face of the printed wiring board 10F where the COH 16 is formed. The other structures are the same as or similar to those of the printed wiring board 10D illustrated in FIG. 5.

Also in the third embodiment illustrated in FIG. 7, the package 20 is electrically connected to power supply layers 19 via the through-via 13 (the COH 16). Moreover, not only a reduction in wiring capacitance may be reduced but also a current value per one package terminal may be secured by the package terminal 20 electrical connected to the power supply layer 19 through a build up via 15.

Figure 8:
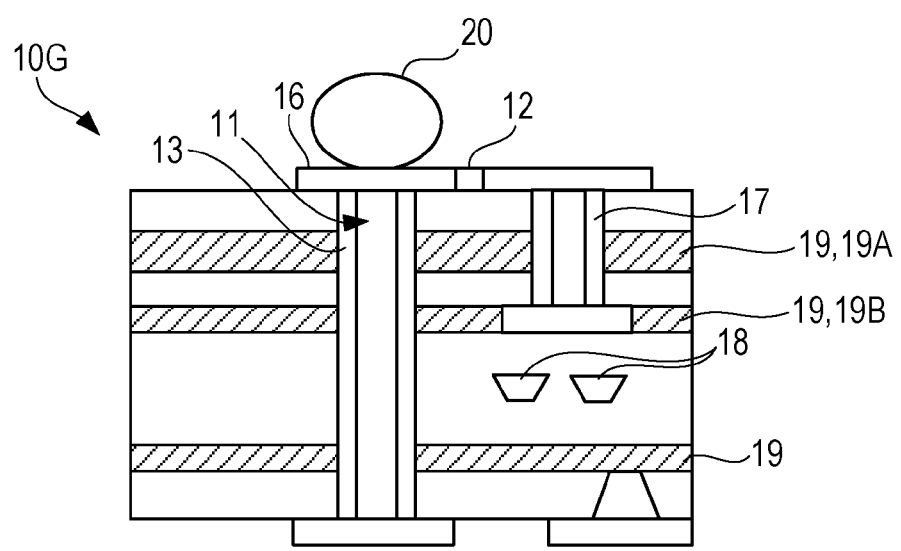
FIG. 8 illustrates a sectional view indicative of a printed wiring board according to a fourth embodiment.

FIG. 8 illustrates a sectional view indicative of a printed wiring board according to a fourth embodiment. Hereinafter differences between a printed wiring board according to the fourth embodiment and the printed wiring board 10E according to the second embodiment illustrated in FIG. 6 will be disclosed.

In a printed wiring board 10G according to the fourth embodiment illustrated in FIG. 8, there is formed a COH 16 where a conductive material fills inside a through-via 13. It is different from the printed wiring board 10E according to the second embodiment illustrated in FIG. 6 where the footprint 11 is formed on the SVH (or the IVH) 17. The footprint 11, to which a package terminal 20 is electrically connected, is formed on the COH 16. The other structures the printed wiring board 10G are the same as those of the printed wiring board 10E illustrated in FIG. 6.

Also in the fourth embodiment illustrated in FIG. 8, a package terminal 20 is electrically connected to power supply layers 19 through the through-via (the COH 16). At the same time, the package terminal 20 is electrically connected to the power supply layers 19 through an SVH (or an IVH) 17. In consequence, not only a reduction in wiring capacitance may be reduced but also a current value per one package terminal may be increased.

Figure 9:
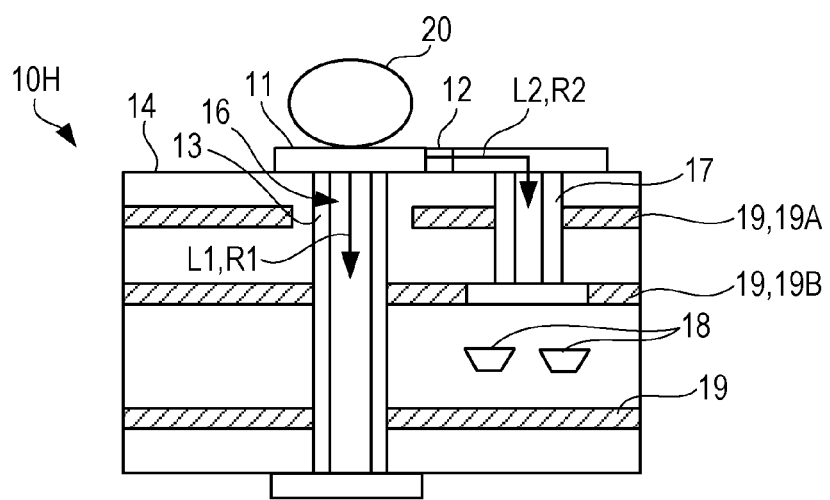
FIG. 9 illustrates a sectional view indicative of a printed wiring board according to a fifth embodiment.

FIG. 9 illustrates a sectional view indicative of a printed wiring board according to a fifth embodiment. Hereinafter differences between the printed wiring board 10G according to the fourth embodiment illustrated in FIG. 8 and a printed wiring board according to the fifth embodiment will be disclosed.

In the printed wiring board 10G according to the fourth embodiment illustrated in FIG. 8, both of the through-via 13 (the COH 16) and the SVH (or the IVH) 17 are electrically connected to both of the power supply layer 19A, which is closest to a top face of the printed wiring board 10G in the power supply layer 19, and the power supply layer 19B. However, according to the fifth embodiment illustrated in FIG. 9, a through-via 13 (a COH 16) is electrically connected to a power supply layer 19B, as a second layer, without being electrically connected to a power supply layer 19A, as a first layer, which is a layer closest to the top face in power supply layers 19, in a printed wiring board 10H. On the other hand, an SVH (or an IVH) 17 is also electrically connected to the power supply layer 19A as the first layer.

A length of a first path extending from a footprint 11, through the through-via 13 (a COH 16), and down to a first power supply layer 19 (note that it is the power supply layer 19B as the second layer), to which the through-via 13 (the COH 16), is electrically connected, is defined as L1. A resistance value is defined as R1. On the other hand, a length of a second path extending from the footprint 11, through the SVH (or the IVH) 17, and down to a first power supply layer 19 (note that it is the power supply layer 19A as the first layer), to which the SVH (or the IVH) 17 is electrically connected, is defined as L2. A resistance value is defined as R2. In the printed wiring board 10H illustrated in FIG. 9, the length L1 is equal to the length L2 and the resistance value R1 is equal to the resistance value R2. Thus both values are equal.

By virtue of the structure disclosed above, a flow of current is divided so as not to concentrate in either of the two paths, so that the sum of current values of both paths may be increased.

Note that the two resistance values (R1 and R2) are made equal (R1=R2) by making the length L1 and the length L2 equal (L1=L2). However, the flow of current may be made equal by making an adjustment on a film thickness and/or a wiring width of the paths to achieve "R1=R2", even if the length L1 is not equal to the length L2 (L1≠L2).

Figure 10A:
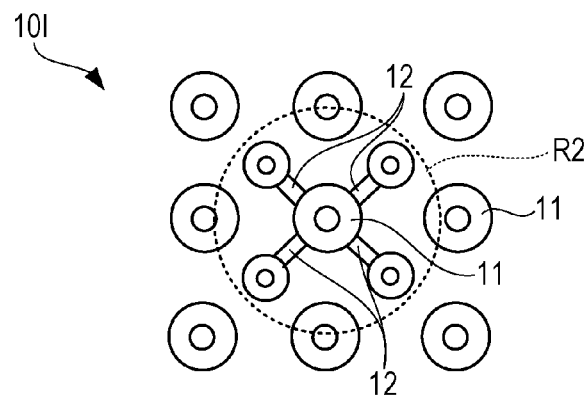
FIGS. 10A and 10B illustrate a plane view (A) indicative of a printed wiring board according to a sixth embodiment and a perspective view (B) indicative of a structure formed of conductive materials with an insulating layer being removed.
Figure 10B:
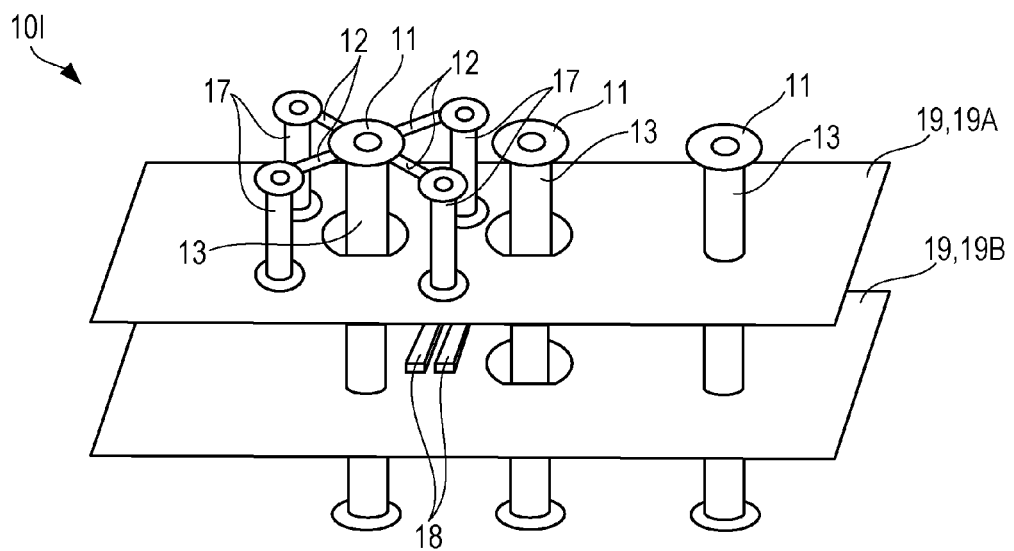

FIGS. 10A and 10B illustrate a plane view (A) indicative of a printed wiring board 10I according to a sixth embodiment and a perspective view (B) only indicative of a structure formed of conductive materials with an insulating layer being removed.

One through-via 13 is formed within a circle R2 illustrated in FIG. 10(A), and four SVHs (or IVHs) 17 are formed around the through-via 13. The one through-via 13 and four SVHs (or the IVHs) 17 are electrically connected through a lead-out pattern 12. The one through-via 13 is electrically connected to a power supply layer 19B, which is located on a side away from a top face of the printed wiring board 10I, in a plurality of power supply layers 19. The four SVHs (or the IVHs) 17 are electrically connected to a power supply layer 19A which is located on a side closer to the top face of the printed wiring board 10I. Adjustments are made on a length of each of paths, a film thickness, a wiring width or the like so that a resistance value R1 between a footprint 11 and the power supply layer 19B via a through-via 13 and each of resistance values R21, R22, R23, and R24 between the footprint 11 and the power supply layer 19A via one lead-out pattern 12 and the one SVH (or the IVH) 17, with respect to each of the four SVHs (or the IVHs) 17, may be made equal to one another (that is to say, R1=R21=R22=R23=R24).

Moreover, since five paths are formed in the sixth embodiment in FIG. 10, five times as much current may be caused to flow as in the portion where one path is formed.

In consequence, not only the amount of reduction in wiring capacitance may be reduced but also a desired power supply amount of current may be caused to flow by dividing a power supply to the one through-via and the one or the plurality of via(s) that reaches down to a certain layer of the printed wiring board (for example, the build up via, the SVH, the IVH or the like) even in lieu of the recent trend in which a large number of pins are arranged at reduced pitches.

The printed circuit board disclosed in the above embodiments is applicable to devices in which high-density implementation is desirable, for example, a PC, a server, a mobile phone or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A printed wiring board comprising:
    a land formed on a surface layer;
    a power supply pattern formed on a layer except the surface layer on which the land is formed;
    a plurality of vias which includes a first via electrically connected to the power supply pattern and a second via electrically connected to the power supply pattern;
    a bottom surface of the second via directly contacting an uppermost surface of the power supply pattern;
    a package terminal directly overlaying the second via;
    the first via is directly connected to the second via through the land and a lead-out pattern on the surface layer; and
    the first via and the second via are electrically connected to the land.

2. The printed wiring board according to claim 1 further comprising:
    a first path which reaches to the power supply pattern from the land through the first via; and
    a second path which reaches to the power supply pattern from the land through the second via, wherein
    the first via and the second via have equal resistance values.

3. The printed wiring board according to claim 1, wherein
the printed wiring board is a multilayer printed board having a plurality of power supply patterns and
the first via and the second via are electrically connected to any of the power supply patterns formed on the plurality of layers.

4. The printed wiring board according to claim 1, wherein the first via is electrically connected to a plurality of second vias.

5. A printed wiring board comprising:
a plurality of conductive layers, which includes a power supply layer and a wiring layer, formed in the printed wiring board;
an insulating layer which is alternately laminated on the conductive layers;
a first via which penetrates through the printed wiring board from a top face to a bottom face and is electrically connected to the power supply layer;
a second via which is electrically connected to the first via through a lead-out pattern formed on a surface layer and reaches to the power supply layer; and
a footprint which is provided on the surface layer and on the first via or the second via, and on which a package terminal formed on a bottom face of a grid array type package is mounted.

6. The printed wiring board according to claim 5, further comprising:
a second power supply layer which is laminated on and adjacent to an insulating layer of the surface layer of the printed wiring board, wherein
the second via penetrates through the insulating layer of the surface layer and reaches to the second power supply layer.

7. The printed wiring board according to claim 5, wherein the second via reaches to another power supply layer, which is formed as a second layer or a following layer of the plurality of conductive layers, from the surface layer toward another surface layer of the printed wiring board.

8. The printed wiring board according to claim 5, wherein the footprint is formed directly above the first via.

9. The printed wiring board according to claim 5, wherein the footprint is formed directly above the second via.

10. The printed wiring board according to any one of claim 5, further comprising:
a first path which extends through the first via from the footprint and reaches to the power supply layer to which the first via is electrically connected; and
a second path which extends through a second via from the foot print and reaches to a second power supply layer to which the second via is electrically connected, wherein
the first path and the second path have equal resistance values to each other.

11. The printed wiring board according to claim 5, wherein the first via is electrically connected to a plurality of second vias.

* * * * *